(12) United States Patent
Gässler et al.

(10) Patent No.: US 6,365,477 B1
(45) Date of Patent: Apr. 2, 2002

(54) METHOD FOR PRODUCING A HETEROBIOPOLAR TRANSISTOR

(75) Inventors: Christoph Gässler, Dornstadt; Helmut Leier, Gruibingen, both of (DE); Hyunchol Shin, Suwon (KR)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/363,746

(22) Filed: Jul. 30, 1999

(30) Foreign Application Priority Data

Jul. 31, 1998 (DE) .......................................... 198 34 491

(51) Int. Cl.⁷ ............................................. H01L 21/331
(52) U.S. Cl. ........................ 438/312; 438/318; 438/359
(58) Field of Search ................................. 438/321, 320, 438/343, 312, 317, 318, 319, 359

(56) References Cited

U.S. PATENT DOCUMENTS

| | | | |
|---|---|---|---|
| 4,933,732 A | | 6/1990 | Katoh et al. |
| 5,445,976 A | | 8/1995 | Henderon et al. |
| 5,569,944 A | | 10/1996 | Delaney et al. |
| 5,571,732 A | | 11/1996 | Liu |
| 5,625,206 A | | 4/1997 | Chandrasekhar et al. |
| 5,656,515 A | | 8/1997 | Chandrasekhar et al. |
| 5,665,614 A | | 9/1997 | Hafizi et al. |
| 5,702,958 A | | 12/1997 | Liu et al. |
| 5,789,301 A | * | 8/1998 | Hill ............................. 438/312 |
| 5,821,149 A | * | 10/1998 | Schppen et al. ............ 438/312 |
| 6,165,859 A | * | 12/2000 | Hamm et al. ................ 438/312 |

FOREIGN PATENT DOCUMENTS

| | | |
|---|---|---|
| DE | 195 47 966 A1 | 6/1996 |
| EP | 0 592 765 A2 | 4/1994 |
| EP | 0 778 622 A2 | 6/1997 |
| EP | 0 810 645 A2 | 12/1997 |

OTHER PUBLICATIONS

Kalingamudali, S.R.D., et al.: Recombination Current Reduction in AlGaAs Heterojunction Bipolar Transistors With Polyimide Deposition. In: Solid–State Eelctronics, vol. 37, No. 12, 1994, pp. 1977–1982.

Shigematu, H. et al.: Ultrahigh $f_{max}$ and $f_{max}$ New Self–Alignment InP/InGaAs HBT's with a Highly Be–doped Base Layer Grown by ALE/MOCVD. In: IEEE Electron Device Letters, vol. 16, No. 2, Feb. 1995, pp. 55–57.

Ida, Minoru, et al.: Enhancement of $f_{max}$ InP/InGaAs HBt's by Selective MOCVD Growth of Heavily–Doped Extrinsic Base Regions. In: IEEE Transactions On Electron Devices, vol. 43, No. 11, Nov. 1996, pp. 1812–1817.

Patent Abstracts of Japan, No. 07142507 A.
Patent Abstracts of Japan, No. 09293733 A.
Patent Abstracts of Japan, No. 09289215 A.
Patent Abstracts of Japan, No. 09246281 A.
Patent Abstracts of Japan, No. 09064058 A.
Patent Abstracts of Japan, No. 08051118 A.
Patent Abstracts of Japan, No. 07245317 A.
Patent Abstracts of Japan, No. 10098052 A.

(List continued on next page.)

Primary Examiner—Tuan H. Nguyen
(74) Attorney, Agent, or Firm—Venable; Norman N. Kunitz

(57) ABSTRACT

A method for producing a heterobipolar transistor, arranged on a substrate of semiconductor material on which is grown a semiconductor sequence for a collector, a base and an emitter, which method includes: etching the layer sequence to form a transistor with a mesa structure, carrying out a first planarizing step to the upper limit of the base during which the surface of the base is protected by a protecting portion of the emitter layer adjacent to the base; removing this protective layer; depositing a metal contact layer for the base; carrying out a second planarizing step for the base emitter mesa; and finally depositing a connecting metallization layer for the collector, base and emitter.

9 Claims, 3 Drawing Sheets

OTHER PUBLICATIONS

Patent Abstracts of Japan, 6–224212 A., E–1628, Nov. 10, 1994, vol. 18, No. 590.

Patent Abstracts of Japan, 3–174734 A., E–1126, Oct. 24, 1991, vol. 15, No. 419.

Patent Abstracts of Japan, 4–96334 A., E–1234, Jul. 15, 1992, Vol. 16. No. 324.

Patent Abstracts of Japan, 3–153043 A., E–1116, Sep. 27, 1991, vol. 15, No. 383.

Patent Abstracts of Japan, 3–192727 A., E–1134, Nov. 18, 1991, vol. 15, No. 45.

Patent Abstracts of Japan, 3–179748 A., E–1128, Oct. 30, 1991, vol. 15, No. 428.

Patent Abstracts of Japan, 6–267969 A., E–1647, Dec. 19, 1994, vol. 18, No. 673.

* cited by examiner

METHOD FOR PRODUCING A HETEROBIOPOLAR TRANSISTOR

CROSS-REFERENCE TO RELATED APPLICATIONS

This application claims the priority of German Application No. 198 34 491.0, filed in Jul. 31, 1998, the disclosure of which is incorporated herein by reference.

BACKGROUND OF THE INVENTION

The invention relates to a method for producing a heterobipolar transistor that is formed on a substrate of semiconductor material by initially growing a sequence of semiconductor layers for an emitter, a base and a collector, and a heterobipolar transistor produced according to the method.

Components with outstanding high-frequency characteristics are required for producing high-frequency circuits, e.g. power amplifiers, oscillators or mixers. An increase in the limiting frequencies $f_T$ and $f_{max}$ of transistors in this case represents an important precondition for technical innovation in the field of mobile or short-range communication systems, as well as phase-array antennas.

To date, transistors are known from the reference by Shigematsu, H. et al.; IEEE Electron Device Letters, Vol. 16, No. 2, pp. 55–57, (1995), which discloses a method for producing an InP/InGaAs heterobipolar transistor in connection with a polyimide planarizing technique for the base contacting, for use with high frequencies. The component production takes place by means of a self-adjustment processing sequence on an involved, so-called dummy emitter structure with spacers. The desirable goal therefore would be to find the simplest possible production method, for which the processing sequence is reliable and which allows a lowering of parasitic capacities.

It follows from the references by Asbeck, P. M. et al.; IEEE Electron Device Letters, Vo. EDL-5, No. 8, pp. 310–312, (1984) and Ho, M. C. et al.; IEEE Electron Device Letters, Vol. 16; No. 11, pp.512–514, (1995), for example, that other methods use the implantation process for insulating the extrinsic region of the base. The implantation process always causes damage to this base region, which results in an undesirable increase in the base-collector-capacity and thus a worsening of the high-frequency characteristics of a transistor.

It is the object of the invention to provide a method which makes it possible to optimize the high-frequency characteristics of a heterobipolar transistor by minimizing the parasitic base collector capacity, so as to effect an increase in the limiting frequencies $f_T$ and $f_{max}$, as well as a transistor formed according to the method.

SUMMARY OF THE INVENTION

The above object generally is achieved according to the present invention by a method for producing a heterobipolar transistor, arranged on a substrate of semiconductor material which comprises: growing a semiconductor layer sequence for a collector, a base and an emitter on the surface of the substrate; configuring the transistor in a mesa design with the outer surface of the base layer being covered by a protective layer of at least one adjacent emitter layer; carrying out a first planarizing step by forming an insulating layer on the upper surface of the substrate to the outer limit of the base layers; partially removing a portion the at least one adjacent emitter layer to expose the upper surface of the base layer; forming a base contact on the exposed surface of the base layer; carrying out a second planarizing step by forming a second insulating layer on the upper surface of the substrate to at least the outer surface of the emitter layer; and, forming surface contacts for the emitter, base and collector by forming openings in the insulating layer where necessary and then depositing a final coating of metal. A method according to claim 1, wherein polyimide layers are used on the insulating layer during the first and second planarizing steps. Advantageous embodiments and modifications of the invention likewise are disclosed and discussed.

The invention includes a two-stage method for planarizing a semiconductor surface with polyimide. In contrast to the state of the technology, this method prevents potential damage to the extrinsic region of the base. The processing sequence involves the growth of a layer sequence on a substrate of semiconductor material, on which layers for a collector, a base and an emitter are deposited one above the other. The transistor is subsequently configured in a mesa design. Following this, a first planarizing step up to the base mesa is realized, wherein during this first planarizing step, a remaining portion of the following emitter layer protects the surface of the base. This protective layer is subsequently removed, e.g., through a wet chemical etching that causes little damage, and the metal layer is deposited on the base. The base mesa has extremely small dimensions, so that the base metal expands laterally over the first planarizing layer and, in particular, a metal conducting strip is guided across the planarizing layer for the contacting. In a second planarizing step, a level semiconductor surface is generated up to and over the emitter mesa.

One particular advantage of the invention is that the high-frequency characteristics of a transistor can be optimized through minimizing the parasitic base collector capacity $C_{BC}$ by protecting on the one hand the base layers during the processing and by providing the base with correspondingly narrow dimensions. Another advantage of the planarizing results from the fact that technologically the individual steps of the processing sequence can be controlled easily, wherein the material selection, for example, is not limited to InP, but can also be extended to other semiconductor layer sequences. The invention is explained below with the aid of advantageous embodiments and by referring to the schematic drawings in the Figures.

DETAILED DESCRIPTION OF THE PREFERRED EMBODIMENTS

Figure 1:
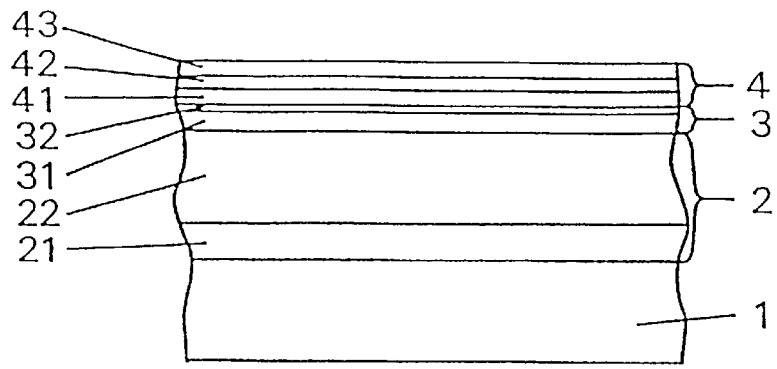
FIG. 1 shows a layer sequence of the heterobipolar transistor according to the invention.

In a first exemplary embodiment according to FIG. 1, a layer sequence for an InP/InGaAs heterobipolar transistor is grown on a 2-inch semi-insulating InP substrate 1 with the aid of molecular-beam epitaxy. The individual layer sequence is composed of:

an InGaAs n⁺ subcollector layer 21 with a thickness of 600 nm and doping concentration of approximately $1 \times 10^{19}$ cm$^{-3}$; and an InGaAs n-collector layer 22 with a thickness of 500 nm and doping concentration of approximately $1 \times 10^{16}$ cm$^{-3}$;

an InGaAs p⁺ base layer 31 with a thickness of 90 nm and the Be- or C-doping concentration of approximately $4 \times 10^{19}$ cm$^{-3}$;

an InGaAs intrinsic base spacer layer 32 with a thickness of 7 nm;

an InP n-emitter layer 41 with a thickness of 60 nm and doping concentration of approximately $3 \times 10^{17}$ cm$^{-3}$;

a first n⁺ emitter capping layer 42 of InP with a thickness of 50 nm and doping concentration of approximately $1 \times 10^{19}$ cm$^{-3}$;

a second n+ emitter capping layer 43 of InGaAs with a thickness of 180 nm and doping concentration of approximately $1 \times 10^{19}$ cm$^{-3}$.

Figure 2:
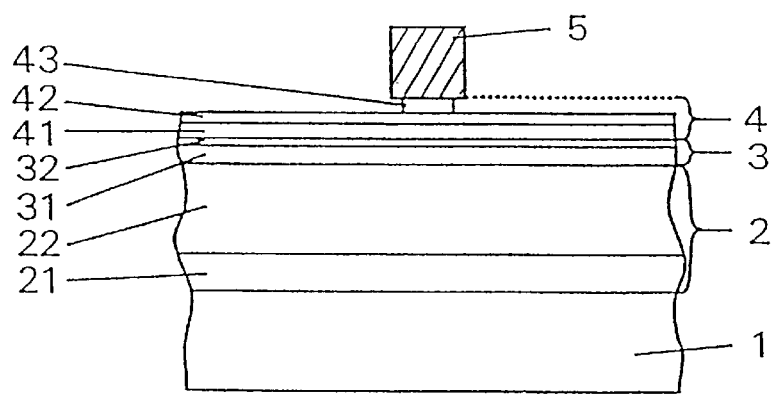
FIG. 2 shows the self-adjustment of the emitter.
Figure 3:
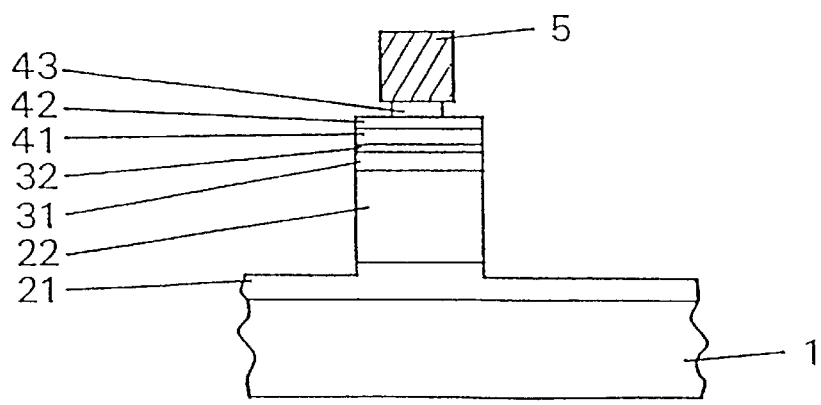
FIG. 3 illustrates the production of the base collector mesa.

The component production with the underlying layer sequence according to FIG. 1 starts with the emitter metallization 5, which is preferably composed of the metal layer sequence Ti/Pt/Au formed on the second emitter capping layer 43 as shown in FIG. 2. The second n⁺ emitter capping layer 43 of InGaAs is subsequently removed by etching, wherein the preceding emitter metallization 5 functions as a self-adjusting etching mask. The InP n-emitter layer 41 and the first n⁺ emitter capping layer 42 of InP are initially retained as complete surface protection layers over the InGaAs base layers 31 and 32.

Figure 4:
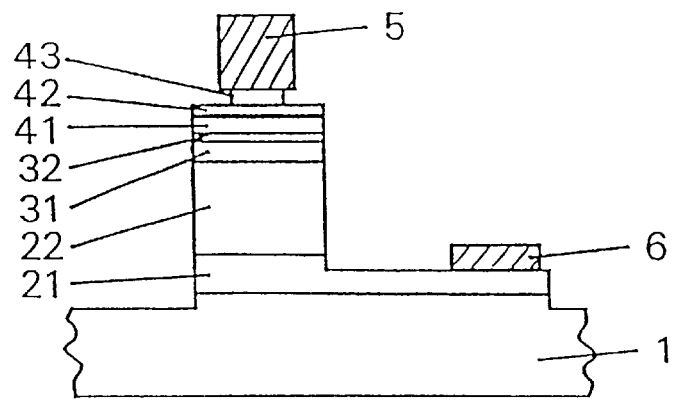
FIG. 4 shows the complete transistor with a mesa design.
Figure 9:
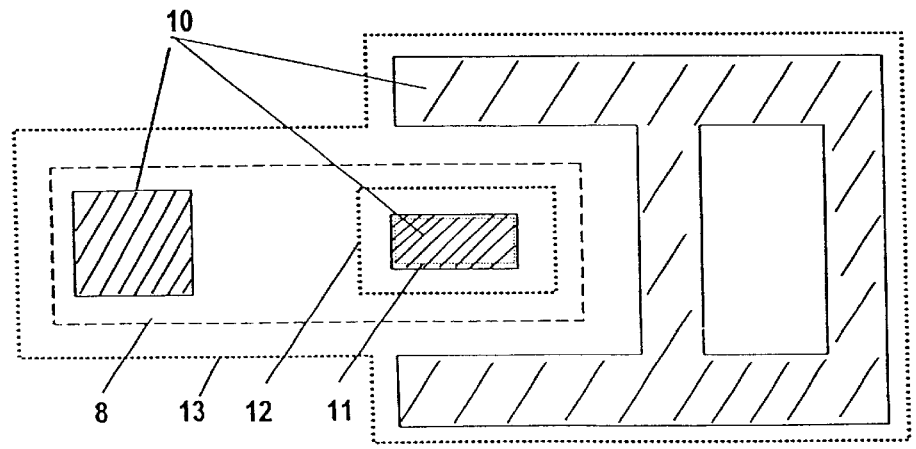
FIG. 9 illustrate the transistor design with a mesa structure according to the invention in projection.

A photosensitive resist mask is used to produce a base collector mesa 12 (FIG. 9) with extraordinarily small dimensions, which extends into the n⁺ subcollector layer 21 as can be seen in FIG. 2. In that case, a chemically aided ion-beam etching method (CAIBE) which uses a process gas mixture Cl$_2$/Ar is selected for the removal of the InP layers 41 and 42. The InGaAs layers 21, 22, 31 and 32 are removed in a wet-chemical process with a phosphoric acid hydrogen peroxide mixture ($H_3PO_4:H_2O_2:H_2O$). The subsequent creation of a collector substrate mesa 13 (Figure a), which extends into the substrate 1, serves to insulate the component as shown in cross section in FIG. 4. In addition, the collector contact metal 6 is applied to the surface of layer 21 with the aid of a photosensitive resist mask.

Figure 5:
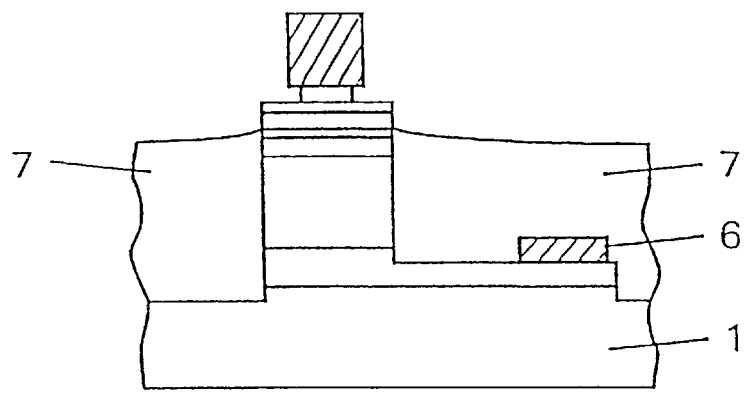
FIG. 5 illustrates the first planarizing step up to the base mesa with remaining portion of emitter layer that follows the base of the transistor of FIG. 4.
Figure 6:
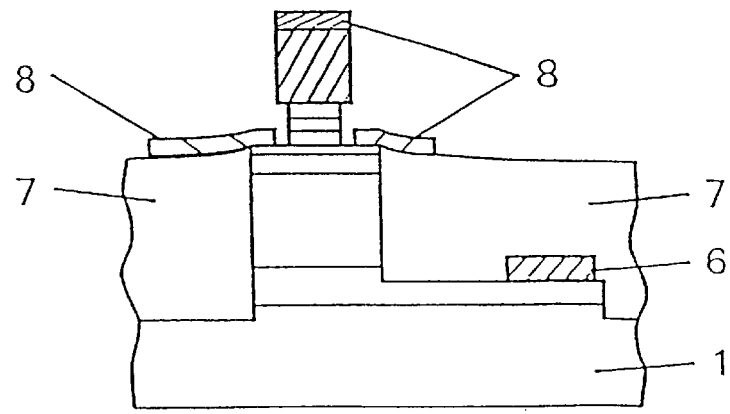
FIG. 6 shows the subsequent metallizing of the base of the device of FIG. 5.

In a subsequently realized first planarizing step, the semiconductor surface is covered up to the upper limit of the base layer 32. In this process step, and as shown in FIG. 5, a first insulating layer 7, preferably a polyimide layer, is deposited, which layer 7 is etched back up to the upper limit of the base layer 32 by means of a reactive ion-etching method (RIE) in the oxygen plasma. The InP protective emitter layer formed by layers 41 and 42 on the surface of the base layer is of central importance for the etching back of the polyimide layer 7. Subsequently, as shown in FIG. 6, the InP n-emitter layer 41 and the first n⁺ emitter capping layer 42 of InP are partially removed with an etching solution on the basis of hydrochloric acid, again using the emitter metallization 5 as an etching mask, and immediately after that, the base metal 8 is deposited, self-adjusting relative to the emitter base mesa 11, on the base layer 32. The base metal 8 in that case extends laterally to and over the surface of the first planarizing layer 7 to form as a metal conducting strip for the base contacting.

Figure 7:
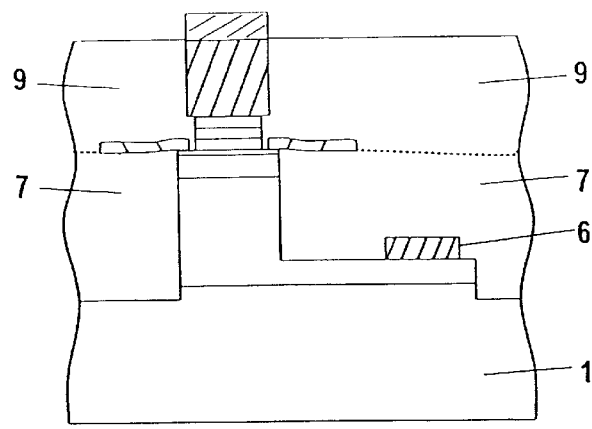
FIG. 7 illustrates a second planarizing step, extending over the emitter base mesa of the device of FIG. 6.
Figure 8:
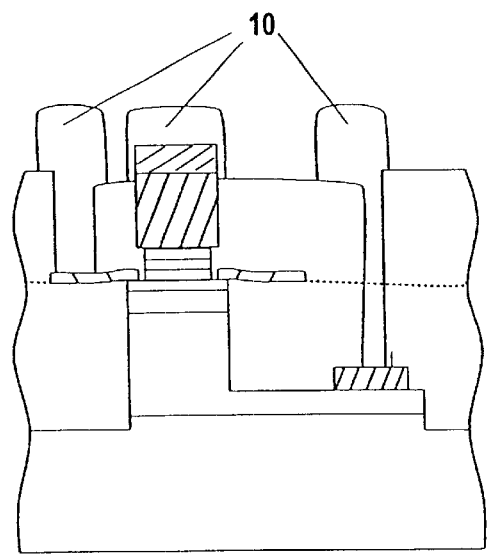
FIG. 8 illustrates the subsequent contacting of the emitter, base and collector regions of the transistor.

In a second planarizing step, the semiconductor surface is covered to the upper emitter limit, i.e., at least over the emitter layer 43 and preferably including the emitter metallization layer 5. For this purpose and as shown in FIG. 7, a second polyimide layer 9 is again deposited over the semiconductor surface and is etched back in an oxygen plasma to the upper emitter limit, i.e., preferably the emitter metal layer 5 as shown. The final processing step, as shown in FIG. 8, involves the metallization 10 for connecting the emitter 4, the base 3 and the collector 2 through reactive ion etching of the layers 9 and 7 to provide holes therein over the metal contact layer 6 and 8 and an electrochemical depositing of gold in the holes in the intended regions to contact the layers 6 and 8 as well as the emitter contact 5. With a transistor formed as described above, an improvement of the high-frequency characteristics of a transistor through a reduction of the parasitic base collector capacity $C_{BC}$ by 56% and consequently a considerable increase in the limiting frequencies $f_T$ and $f_{max}$ of up to 35% were observed.

The semiconductor layer sequence can be varied in a second exemplary embodiment, which is based on the processing sequence used for the above exemplary embodiment. It is also possible, for example, to omit the IGaAs intrinsic base spacer layer 32 and/or the first n⁺ emitter capping layer 42 of InP. Furthermore, the n-emitter layer 41 and the first n⁺ emitter layer 42 can also consist of InAlAs.

In a third exemplary embodiment, a layer sequence of a GaAs/AlGaAs heterobipolar transistor is grown with the aid of molecular-beam epitaxy on a semi-insulating GaAs substrate 1. The individual layers of the layer sequence consist of:

a GaAs n⁺ subcollector layer 21 with a thickness of 600 nm and doping concentration of approximately $5 \times 10^{18}$ cm$^{-3}$; and a GaAs n-collector layer 22 with a thickness of 500 nm and doping concentration of approximately $1 \times 10^{16}$ cm$^{-3}$;

a GaAs p+ base layer 31 with a thickness of 90 nm and Be- or C-doping concentration of approximately $4 \times 10^{19}$ cm$^{-3}$;

a GaAs intrinsic base spacer layer 32 with a thickness of 7 nm;

an AlGaAs n-emitter layer 41 with an Al content of between 25%–35%, a thickness of 60 nm and doping concentration of approximately $3 \times 10^{17}$ cm$^{-3}$;

a first n⁺ emitter capping layer 42 of GaAs with a thickness of 200 nm and doping concentration of approximately $5 \times 10^{18}$ cm$^{-3}$.

As an option, it is possible for the first n⁺ emitter capping layer 42 to be followed by a second n⁺ emitter capping layer 43 of InGaAs with a thickness of 20 nm and doping concentration of approximately $1 \times 10^{19}$ cm$^{-3}$, wherein the In-content of the layer has a gradient between 0% and 50%. In the same way, an AlGaAs n-layer with a gradient for the Al content between 30% and 0%, a thickness of 30 nm and doping concentration of approximately $1 \times 10_{18}$ cm$^{-3}$ can be used between the n-emitter layer 41 and the first n⁺ emitter capping layer 42.

It will be understood that the above description of the present invention is susceptible to various modifications, changes, and adaptations, and the same are intended to be comprehended within the meaning and range of equivalents of the appended claims.

We claim:

1. A method for producing a heterobipolar transistor arranged on a substrate of semiconductor material, including:

growing a semiconductor layer sequence for a collector, a base and an emitter on the surface of the substrate;

configuring the transistor in a mesa design with the outer surface of the base layer being entirely covered by a protective layer of at least one adjacent emitter layer, thereafter carrying out a first planarizing step by forming an insulating layer on the upper surface of the substrate to the outer limit of the base layer;

thereafter partially removing a portion of the at least one adjacent emitter layer to expose the outer surface of the base layer;

forming a base contact on the exposed surface of the base layer;

carrying out a second planarizing step by forming a second insulating layer on the upper surface of the substrate to at least the outer surface of the emitter layer; and, forming surface contacts for the emitter, base and collector by forming openings in the insulating layers where necessary and then depositing a final coating of the metal.

2. A method according to claim 1, wherein polyimide layers are used as the insulating layer during the first and second planarizing steps.

3. A method according to claim 1, wherein the step of forming a base contact includes depositing metal for the base contact such that it extends laterally from the base layer surface over regions of the outer surface of the first planarizing layer.

4. A method according to claim 1 wherein the step of configuring includes: depositing an emitter contact on the outer surface of the emitter layers; etching the outer emitter layer, using the emitter contact as an etching mask, to remove the outer emitter layer except for a portion beneath the emitter contact; and then etching the remaining layers to form the mesa configuration of the transistor.

5. A method as defined in claim 4 further comprising depositing a collector contact on an outer surface of a collector layer prior to said step of partially removing.

6. A method as defined in claim 5 wherein the step of forming a base contact includes depositing base contact metal on the exposed portion of the surface of the outer base layer using the emitter contact as a self aligning deposition mask.

7. A method as defined in claim 6 wherein the step of carrying out a second planarizing step includes forming the second insulating material layer to a height substantially corresponding to the outer surface of the emitter contact.

8. A method as defined in claim 7 wherein the step of forming surface contacts includes forming openings through the second insulating layer to expose the base contact and through the first and second insulating layers to expose the collector contact.

9. A method as defined in claim 1 wherein the step of carrying out a second planarizing step includes forming the second insulating material layer to a height substantially corresponding to the outer surface of the emitter.

* * * * *